United States Patent
Li

(10) Patent No.: US 7,598,752 B2
(45) Date of Patent: Oct. 6, 2009

(54) CHARGE TRANSFER DEVICE AND METHOD, TOUCH SENSING DEVICE AND METHOD

(75) Inventor: Zhiqian Li, Beijing (CN)

(73) Assignee: Beijing, Sigmachip Co., Ltd., Beijing (CN)

( * ) Notice: Subject to any disclaimer, the term of this patent is extended or adjusted under 35 U.S.C. 154(b) by 251 days.

(21) Appl. No.: 11/618,416

(22) Filed: Dec. 29, 2006

(65) Prior Publication Data

US 2007/0247172 A1 Oct. 25, 2007

(30) Foreign Application Priority Data

Apr. 19, 2006 (CN) .......................... 2006 1 0075679

(51) Int. Cl.
*G01R 27/26* (2006.01)
*G06F 3/041* (2006.01)
(52) U.S. Cl. ..................... 324/657; 324/681; 345/173; 178/18.06
(58) Field of Classification Search ................ 324/687; 341/33; 345/173; 178/18.06
See application file for complete search history.

(56) References Cited

U.S. PATENT DOCUMENTS

| 5,730,165 | A | 3/1998 | Philipp |
| 6,452,514 | B1* | 9/2002 | Philipp ........................ 341/33 |
| 6,466,036 | B1 | 10/2002 | Philipp |
| 6,993,607 | B2 | 1/2006 | Philipp |

* cited by examiner

*Primary Examiner*—Vincent Q Nguyen
(74) *Attorney, Agent, or Firm*—Rader, Fishman & Grauer, PLLC

(57) ABSTRACT

The disclosure relates to a touch sensing device and method. An embodiment of the disclosed method includes starting to count with a counter while charging a sensing point which has distributed capacitance periodically, then transferring the charge on the sensing point to a second capacitor. Next, the voltage on the second capacitor is compared with a reference voltage, and if the former exceeds the latter, the counter stops counting and saving the value. If the voltage on the second capacitor is less than the reference voltage, the sensing point is judged to determine whether it is in touching state or in non-touching state according to the saved count value while discharging the second capacitor, clearing the counter after the discharge, then restarting the method. Using the device and method of this disclosure, the touching sensing action can be tested accurately.

8 Claims, 4 Drawing Sheets

US 7,598,752 B2

CHARGE TRANSFER DEVICE AND METHOD, TOUCH SENSING DEVICE AND METHOD

CROSS-REFERENCE TO RELATED APPLICATIONS

This application claims priority from Chinese Patent Application Serial No. 200610075679.6 filed Apr. 19, 2006, the disclosure of which, including the specification, drawings and claims, is incorporated herein by reference in its entirety.

TECHNICAL FIELD

The present disclosure relates to a charge transfer device and method, it further relates to a touch sensing device and method which are based on the charge transfer device and method, and the device and method can be applied in a variety of integrated touch key-presses or switches.

BACKGROUND

At present, most touch key-presses are realized by using the method of capacitance measurement. The conventional method of the existing capacitive touch key-presses is to measure the charge on the unknown capacitor to determine the value of the unknown capacitance. The disadvantages of this method include poor stability and the likelihood that the quantity of the charge on the unknown capacitor will change when it is disturbed by the environment, such that it always can not reflect the value of the capacitance precisely. Further disadvantages include high costs and the fact that, the measurement of the charge needs a high precision ADC (Analog-Digital-Convertor) which has a complex circuit construction, which further increases costs.

SUMMARY

The present disclosure aims at providing a touch key-press with the advantages of low cost, low power consumption, adjustable sensitivity and low error trigger ratio.

Furthermore, this disclosure provides a charge transfer method which comprises charging a first capacitor periodically at regular intervals and transferring the charge accumulated on the first capacitor to a second capacitor periodically at the above time interval.

Other object and features of the present disclosure will become more readily apparent from the following detailed description of the preferred embodiment taken in conjunction with the accompanying drawings.

BRIEF DESCRIPTION OF THE DRAWINGS

The accompanying drawings, which are incorporated in and constitute a part of specification, illustrate an exemplary embodiment of the present invention and, together with the general description given above and the detailed description of the preferred embodiment given below, serve to explain the principles of the present invention.

DETAILED DESCRIPTION

Figure 1:
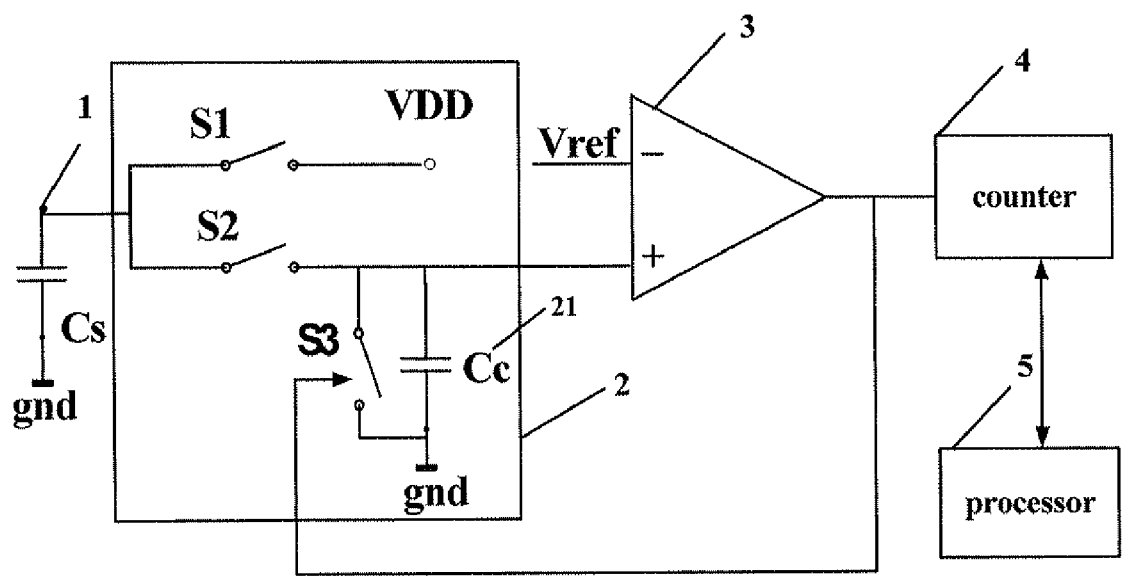
FIG. 1 illustrates the basic principle circuit diagram of a touch sensing device.

While the claims are not limited to the illustrated embodiments, an appreciation of various aspects of the present invention is best gained through a discussion of various examples thereof. Referring now to the drawings, illustrative embodiments will be described in detail. Although the drawings represent the embodiments, the drawings are not necessarily to scale and certain features may be exaggerated to better illustrate and explain an innovative aspect of an embodiment. Further, the embodiments described herein are not intended to be exhaustive or otherwise limiting or restricting to the precise form and configuration shown in the drawings and disclosed in the following detailed description.

First Embodiment

FIG. 1 illustrates a basic principle circuit diagram of a touch sensing device of this disclosure. As shown in FIG. 1, the device comprises a sensing point 1, a charge transfer device 2, a comparator 3, a counter 4, a processor 5 and a third switch S3.

Figure 3:
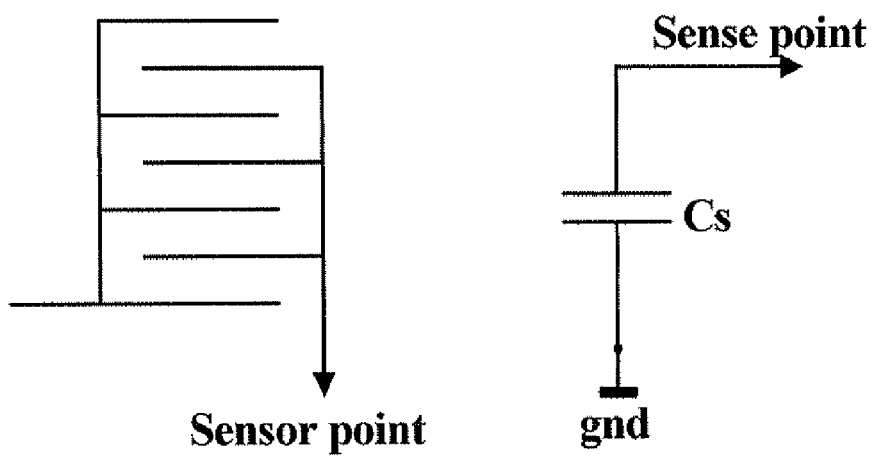
FIG. 3 illustrates a touch sensing point PCB (Printed Circuit Board) and an equivalent capacitance.
Figure 4:
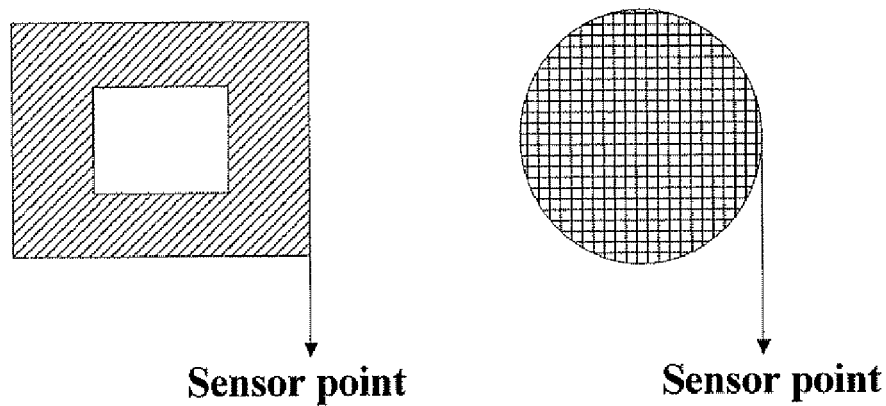
FIG. 4 illustrates other exemplary kinds of touch sensing point PCBs.

The sensing point 1 for sensing the proximity-related capacitance between a different environment and the ground (gnd) is to produce a sensing capacitor Cs. The sensing point or spot 1 is formed by a PCB wire which can be made into shapes as shown in FIG. 3 or FIG. 4 to form an accurate sensing capacitor and guarantee the reliability of the sensing action.

The capacitance of the sensing capacitor Cs produced at the sensing point 1 is very small and the quantity of the transferred charge each time is small, so the measurement of charge is difficult. This disclosure provides a charge transfer device 2 which can accumulate the charge, and the sensing point 1 is charged continuously and the charge on it is transferred and converted into voltage which can be measured.

Figure 2:
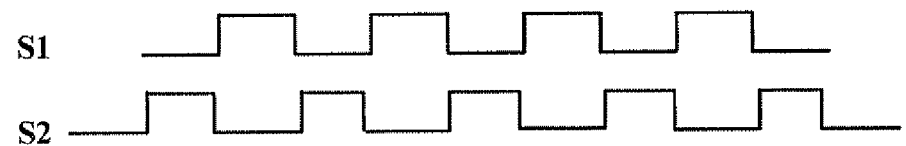
FIG. 2 illustrates a non-overlapping clock signal.

The charge transfer device 2 comprises a first switch S1, a second switch S2 and a capacitor Cc 21. The first switch S1 and the second switch S2 which can be realized using a MOS (Metal-Oxide Semiconductor) tube, triode, relay or optical coupler are controlled by a non-overlapping clock signal as shown in FIG. 2. Therefore, by closing and opening the switches S1 and S2, the capacitor Cs on the sensing point 1 accumulates enough quantity of the charge which is completely transferred to the capacitor Cc 21 to make the voltage VCc large enough to be measured.

Steps of related calculation are as follows:

Upon consumption that the charging voltage of the capacitor Cs is VDD, then the quantity of the charge is $CsV_{DD}$, therefore, after the charging and discharging for the first time, the equation $(Cs+Cc)V_1=CsV_{DD}$ is gained, where $V_1$ is the voltage on the Cc.

The working process is as follows: when the switch S1 closes, the sensing capacitor Cs at the sensing point 1 is charged through the charging voltage VDD; when the switch S1 opens, the switch S2 closes because of the control of the non-overlapping clock signal, so the charge on the capacitor Cs at the sensing point 1 is transferred to the capacitor Cc 21. After the charge transfer of several periods, the charge accumulated on the capacitor Cs at the sensing point 1 is completely transferred to the capacitor Cc 21.

Figure 5:
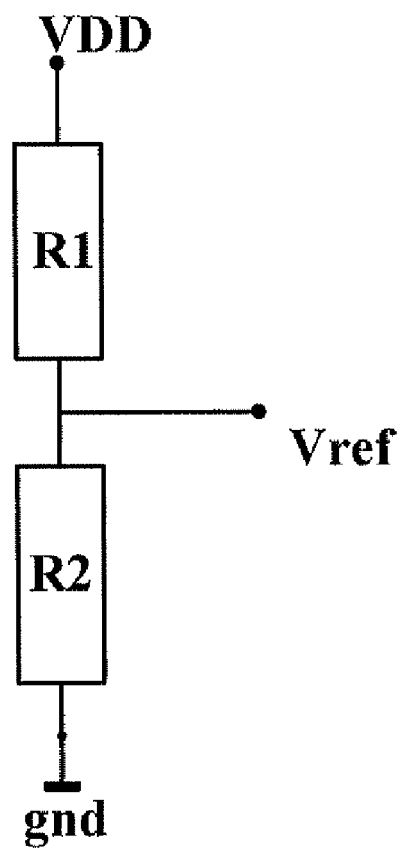
FIG. 5 illustrates a reference voltage realized by using resistance voltage-division.

The charge on the capacitor Cc 21 is converted into voltage which is put into the comparator 3, and the input end of the comparator 3 is the reference voltage $V_{ref}$ which is compared with the voltage VCc on the capacitor Cc 21, the result of the comparison produces a control signal to the counter 4. The reference voltage $V_{ref}$ is realized by the voltage-dividing resistors R1 and R2 as shown in the FIG. 5.

When the comparator 3 overturns, it produces a turnover signal and sends it to the third switch S3 and the counter 4.

After receiving the turnover signal, the third switch S3 closes to discharge the second capacitor and opens after the discharge.

After receiving the turnover signal, the counter 4 stops counting and sends the count value to the processor 5;

After receiving the count value, the processor 5 judges whether the sensing point is in a touch state, at the same time, it returns a signal to clear the counter, and then the counter starts to count again.

In this embodiment, the reference voltage $V_{ref}$ produced at the input end of the comparator 3 is designed to be less than half of the charging voltage of each time, namely less than VDD/2. This is because if the reference voltage is too high, certain system error will be introduced.

If touch action happens, the sensing point 1 will sense the capacitance between the body and the ground, likewise, according to the above-described method, the charge is accumulated on the weak sensing capacitor Cs and converted into voltage VCc on the capacitor Cc 21 continuously. If VCc exceeds the reference voltage Vref, the comparator 3 overturns and sends a stopping signal to the counter 4, then counter 4 stops counting and obtains a new count value which is the new charging count value of the capacitor.

The count value of the counter 4 is entered into the processor 5, the processor 5 calculates the difference between the input count value and the non-touching charging count value set in advance. If the difference exceeds the predetermined standard difference, the processor 5 judges that the sensing point is in a touching state. One of skill in the art in this field can understand that this standard difference can be set according to the hardware parameters of the device.

Therefore, whether there is touching action is judged by detecting the change of the count value of the counter.

Second Embodiment

The sensing capacitor Cs produced at the sensing point 1 varies with temperature and humidity of the environment. Therefore, the charging time of the sensing point 1 changes accordingly. So, the factual non-touching charging count value $T_{nkn}$ changes slowly with the change of the environment. However, if this difference of change exceeds a standard difference, touching action is mistaken. And for the same reason, in a touching state, the environment still affects the count value of the counter, which changes the value of the counter into the non-touching value.

In order to guarantee accurate triggering and higher sensitivity, the change of the sensing capacitor Cs produced at the sensing point 1 is evaluated, and the non-touching charging value is adjusted continuously, and the sensitivity of the standard difference both in a touching state and in a non-touching state are set.

Therefore, an optimized solution is that the touching sensing device of the second embodiment has self-adapting ability. The judgment of the touching action is done by refreshing the non-touching count value and the touching count value continuously through calculating the difference of charging time of two times on the sensing point 1 of two times and comparing the difference with a predetermined threshold.

In the second embodiment, a solution is provided that the non-touching charging count value $T_{nkn}$ always varies with the change of environment to make the new set non-touching charging count value $T_{nkn}$ always equals or approaching the factual one to realize the self-adapting of the sensing point.

The related equation is $$T_{nkn} = \frac{T_{nkn}^0 + T_{nkn}^1}{2}$$

Where $T_{nkn}$ is the new non-touching charging count value, $T_{nkn}^0$ is the last non-touching charging count value and $T_{nkn}^1$ is the current non-touching charging count value.

Likewise, the self-adapting equation of the touching charging count value is $$T_{mkn} = \frac{T_{mkn}^0 + T_{mkn}^1}{2},$$

where $T_{nkn}$ is the new touching charging count value, $T_{nkn}^0$ is the last touching charging count value and $T_{nkn}^1$ is the current touching charging count value.

Figure 6:
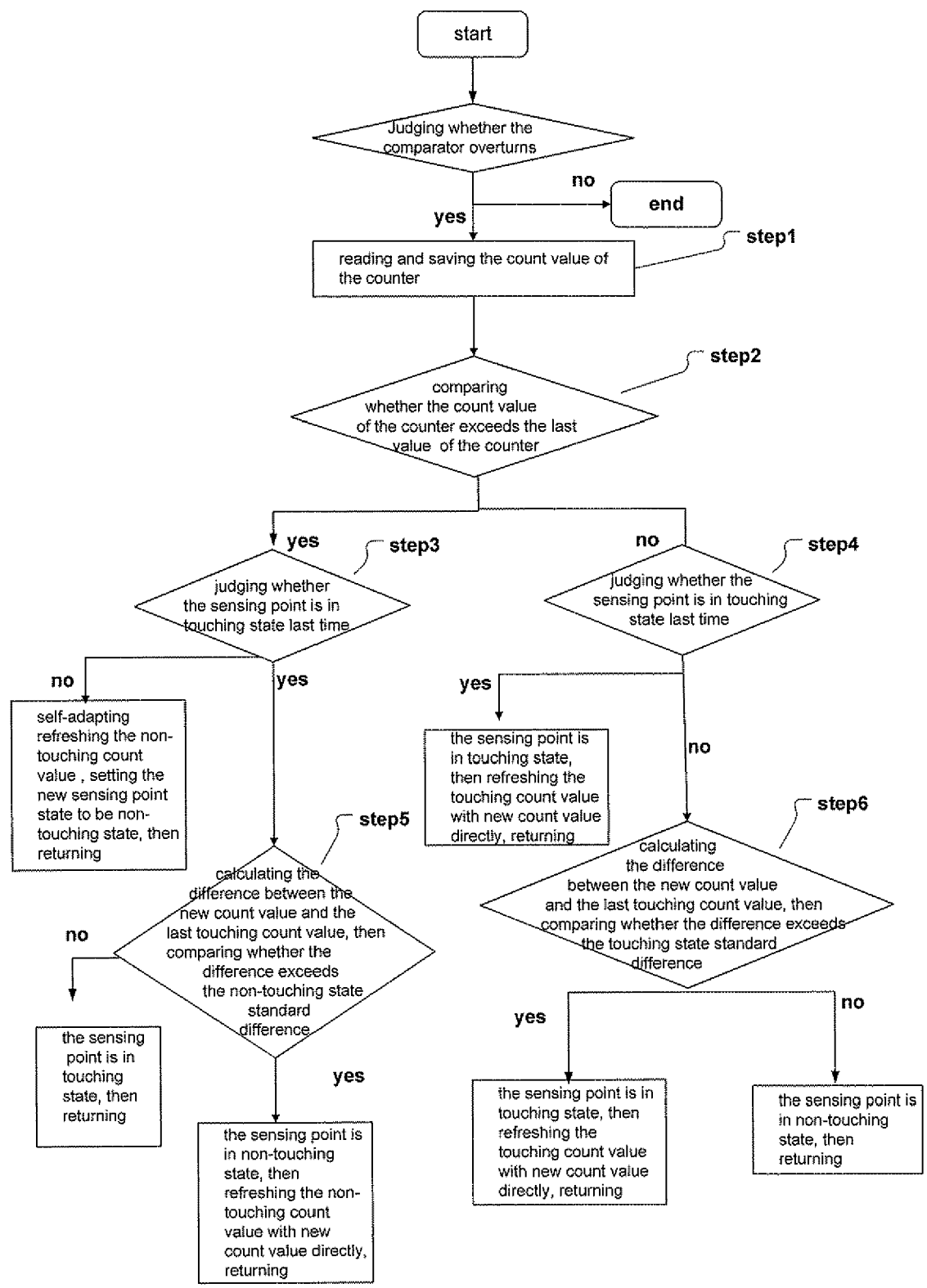
FIG. 6 is a flowchart of touch sensing self-adaptation in accordance with an embodiment of the present disclosure.

In order to achieve the above object, when the comparator overturns and the counter stops counting, the processor 5 of the touching sensing device performs the following steps as shown in the FIG. 6:

In Step 1, the count value of the counter 4 is read and saved.

In Step 2, the count value of the counter is compared to the previous value of the counter to determine if the count value exceeds the last value of the counter; if so, the process proceeds to step 3 if not, the process proceeds to step 4.

In Step 3, a determination is made as to whether the sensing point was in a touching state the last time. If so, the process proceeds to step 5; if not, a self-adapting refreshing of the non-touching count value using $$T_{nkn} = \frac{T_{nkn}^0 + T_{nkn}^1}{2},$$

is employed to set the new sensing point state to be a non-touching state. The process then returns to step 1.

At Step 4, a determination is made as to whether the sensing point is in touching state. If so, the sensing point touching count value is refreshed with a new count value, then returns to step 1. If not, the process performs step 6.

At Step 5, the difference between the current count value and the last touching count value, is calculated, and a determination is made as to whether the difference exceeds a predetermined non-touching state standard difference. If so, the sensing point is in a touching state and the process returns to step 1. If not, the sensing point is in a non-touching state, then the non-touching count value is refreshed with the current count value and the process returns to step 1.

At Step 6, the difference between the current count value and the last touching count value is calculated, and a determination is made as to whether the difference exceeds the predetermined touching state standard difference. If so, the sensing point is in the touching state, and the process refreshes the touching count value with the current count value directly. If not, the sensing point is in a non-touching state, and the process returns to step 1.

In the above-described embodiments, in practice, the scale of the counter is 100~65500. The scale of the touching standard difference and the non-touching standard difference is 10-500. In one embodiment, the touching standard difference is set to be 100 and the non-touching standard difference is set to be 90.

The foregoing description of various embodiments of the invention has been presented for purposes of illustration and description. It is not intended to be exhaustive or to limit the invention to the precise embodiments disclosed. Numerous modifications or variations are possible in light of the above teachings. The embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A touch sensing device comprising:
   a sensing point for producing a sensing capacitor;
   a power supply connected to a first switch for charging the sensing capacitor produced at the sensing point periodically;
   a second capacitor connected with the sensing capacitor via a second switch and the charge accumulated on the sensing capacitor is transferred to the second capacitor;
   a comparator for comparing voltage on the second capacitor with a reference voltage;
   a counter;
   a processor;
   wherein the processor performs the steps of
   a) comparing whether the current count value exceeds the last count value, wherein if the current count value exceeds the last count value, the process proceeds to step b), wherein if the current count value does not exceed the last count value, the process proceeds to step c);
   b) judging whether the sensing point was in a touching state the last time, wherein if the sensing point was in the touching state the last time, the process proceeds to step d), wherein if the sensing point was not in the touching state the last time, the non-touching count value is refreshed with half of the sum of the current count value and the process is ended;
   c) judging whether the sensing point was in a touching state the last time, wherein if the sensing point was in the touching state the last time, the touching count value is refreshed with half of the sum of the current count value and the last count value and the process flow is ended, wherein if the sensing point was not in a touching state the last time, the process proceeds to step e);
   d) calculating the difference between the current count value and the last count value, then comparing whether the difference exceeds a non-touching state standard difference set in advance, wherein if the difference exceeds the non-touching state standard difference, the sensing point is in the non-touching state and the non-touching count value is refreshed with half of the sum of the current count value and the last count value and the process is ended; wherein if the difference does not exceed the non-touching state standard difference, the sensing point is in the touching state and the process is ended; and
   e) calculating the difference between the current count value and the last touching count value, then comparing whether the difference exceeds the touching standard difference; wherein if the difference exceeds the touching standard difference, the sensing point is in a touching state; wherein if the difference is less than the touching standard difference, the sensing point is in a non-touching state;
   a third switch;
   wherein the comparator produces a turnover signal and sends it to the third switch and the counter;
   wherein after receiving the turnover signal, the third switch is closed and the second capacitor discharges, the third switch opens after the discharge;
   and the counter stops counting after receiving the turnover signal and sends a count value to the processor which judges whether the sensing point is in touch state according to the count value, then the processor returns a signal and clears the counter, the counter restarts the count.

2. The touch sensing device according to claim 1, wherein the opening and closing of the first switch and the second switch are controlled by a non-overlapping clock signal respectively.

3. The touch sensing device according to claim 1, wherein the sensing point is constructed of printed circuit board wire.

4. The touch sensing device according to claim 1, wherein the processor calculates a difference between the count value and the non-touching count value set in advance, wherein if the difference exceeds a standard difference, the processor determines that the sensing point is in a touching state, otherwise the sensing point is in a non-touching state.

5. The touch sensing device according to claim 1, wherein the reference voltage is less than half of the charging voltage.

6. The touch sensing device according to claim 1, wherein the first switch and the second switch are one of a metal-oxide semiconductor tube, triode, relay and optical coupler.

7. The touch sensing device according to claim 1, wherein the scale of the count value of the counter is 100-65500.

8. The touching sensing device of claim 1, wherein the scale of the touching standard difference and the non-touching standard difference is 10-500.

* * * * *